United States Patent
Jiang

(10) Patent No.: US 9,899,088 B1
(45) Date of Patent: Feb. 20, 2018

(54) CONTENT ADDRESSABLE MEMORY DECOMPOSITION

(71) Applicant: Xilinx, Inc., San Jose, CA (US)

(72) Inventor: Weirong Jiang, San Jose, CA (US)

(73) Assignee: XILINX, INC., San Jose, CA (US)

(*) Notice: Subject to any disclaimer, the term of this patent is extended or adjusted under 35 U.S.C. 154(b) by 358 days.

(21) Appl. No.: 14/862,750

(22) Filed: Sep. 23, 2015

(51) Int. Cl.
| G06F 12/00 | (2006.01) |
| G11C 15/04 | (2006.01) |
| G06F 3/06 | (2006.01) |
| G06F 12/0802 | (2016.01) |
| G06F 12/0864 | (2016.01) |

(52) U.S. Cl.
CPC .......... *G11C 15/046* (2013.01); *G06F 3/0626* (2013.01); *G06F 3/0638* (2013.01); *G06F 12/0802* (2013.01); *G06F 12/0864* (2013.01)

(58) Field of Classification Search
CPC ... G11C 15/046; G06F 3/0626; G06F 3/0638; G06F 12/0802; G06F 12/0864
See application file for complete search history.

(56) References Cited

U.S. PATENT DOCUMENTS

| 9,111,615 B1 | 8/2015 | Jiang | |
| 2012/0096220 A1* | 4/2012 | Liu | H04L 47/2441 711/108 |
| 2015/0194214 A1* | 7/2015 | Barth, Jr. | G11C 15/04 365/49.17 |

OTHER PUBLICATIONS

Liu, Alex X. et al., "TCAM Razor: A Systemic Approach Towards Minimizing Packet Classifiers in TCAMs," IEEE/ACM Transactions on Networking, Apr. 1, 2010, vol. 18, No. 2, IEEE, Piscataway, New Jersey, USA.
Meiners, Chad R. et al., "SPliT: Optimizing Space, Power, and Throughput for TCAM-Based Classification," Proc. of the 2011 Seventh ACM/IEEE Symposium on Architectures for Networking and Communications Systems, Oct. 3, 2011, pp. 200-210, IEEE, Piscataway, New Jersey, USA.
Srinivasan, V. et al., "Packet Classification using Tuple Space Search," Proc. of the 1999 Conference on Applications, Technologies, Architectures & Protocols for Computer Communication, Aug. 30, 1999, pp. 135-146, ACM, New York, New York, USA.
Jiang, Weirong et al., "Data Structure Optimization for Power-Efficient IP Lookup Architectures," Nov. 2013, pp. 2169-2182, IEEE Transactions on Computers, IEEE, Piscataway, New Jersey, USA.

* cited by examiner

*Primary Examiner* — David X Yi
*Assistant Examiner* — Alan Otto
(74) *Attorney, Agent, or Firm* — LeRoy D. Maunu

(57) ABSTRACT

Circuits and methods are disclosed for decomposition of a content addressable memory into a plurality of CAMs having a lower cost. In an example implementation, a set of CAM rules are grouped into a plurality of subsets. For each of the subsets, CAM rules in the subset are reformatted for storage in a respective CAM configured to store fewer ternary bits or configured for prefix match. Each reformatted subset of CAM rules are stored in the respective CAM. A search key formatting circuit is configured to reformat an input search key for each of the respective CAMs is used to store the reformatted subsets to produce a respective reformatted search key and input the respective reformatted search key to the respective CAM.

20 Claims, 14 Drawing Sheets

CONTENT ADDRESSABLE MEMORY DECOMPOSITION

TECHNICAL FIELD

The disclosure generally relates to content-addressable-memory circuits, and more particularly relates to ternary content-addressable-memory circuits.

BACKGROUND

Random-access-memory (RAM) circuits are well-known data storage devices that store data values in an array of addressed memory locations. To determine whether a particular data value is stored in a typical RAM, an address-based data searching method is performed. Data values are sequentially read out from the RAM and compared with the particular data value. Specifically, a series of identifiers (IDs) are transmitted to an ID port of the RAM, thereby causing data values to be read out from the memory locations associated with the IDs and transmitted to an output port of the RAM. A separate comparator circuit is then used to compare each of the output data values with the searched-for data value, and to generate a signal when a match occurs. When a large number of data values are searched, such ID-based search operations are very time consuming because only one data value is searched/compared each clock cycle.

Content-addressable-memory (CAM) circuits are a particular type of data storage device in which a data value is searched for by its content, rather than by its ID. Data values are stored (pre-loaded) in CAM circuits such that each data value is assigned to a row or column of an array of CAM cells. To determine whether a particular data value is stored in the CAM circuit, a content-based data match operation is performed in which the searched-for data value is simultaneously compared with the rows/columns containing the pre-loaded data values. When one or more of the pre-loaded data values match the searched-for data value, a "match" signal is generated by the CAM circuit, along with an ID indicating the storage location of the stored data value. By simultaneously comparing the searched-for data value with several pre-loaded data values, a CAM circuit is able to simultaneously check multiple stored data values in a single clock cycle. In comparison to RAM, CAM circuits significantly reduce the search time needed to locate a particular data value from a large number of data values. One type of CAM, referred to as ternary content addressable memory (TCAM), stores words having a number of ternary bits. A ternary bit has one of three possible values, for example, logic one, logic zero, and wildcard (*). A stored bit having the wildcard * value will match a bit of a search word having either a logic one or a logic zero value. For example, an input search word 1010 will match multiple ternary words including: 1010, *010, 1*10, 10*0, 101*, 10, 10, 10, *0, 1*, and **. For ease of reference, words stored in a ternary or binary CAM may be referred to as "rules." The searched-for data value may be referred to as a "search key."

SUMMARY

In some various implementations, methods are provided for decomposing a CAM into lower cost CAMs. In an example implementation, a set of CAM rules are grouped by a memory configuration circuit into a plurality of subsets. In each subset, bits in each of the CAM rules can be reordered, according to a respective bit ordering for the subset, to place all wildcard bits in the least significant bit positions. For each of the subsets, bits of CAM rules in the subset are reordered, according to the common bit ordering for the subset, to produce a respective reformatted subset. The reformatted subset is stored in a respective algorithmic CAM circuit (e.g., a prefix match CAM) which requires lower implementation cost than a general TCAM. A search key formatting circuit is configured to, in response to receiving a search key, reformat the search key for each of the reformatted subsets, according to the respective bit ordering used to produce the reformatted subset, to produce a reformatted search key. The search key formatting circuit is also configured to provide the reformatted search key produced for each reformatted subset to the respective algorithmic CAM circuit used to store the reformatted subset.

In another example implementation, a set of N-bit ternary CAM rules are grouped by a memory configuration circuit into a plurality of subsets. For each of the plurality of subsets, the CAM rules in the subset are reformatted to represent each CAM rule using less than N ternary bits to produce a respective reformatted subset. Each reformatted subset of CAM rules is stored in a respective CAM circuit configured to store CAM rules having less than N ternary bits. The memory configuration circuit configures a search key formatting circuit to reformat a received search key for each subset, according to a mapping of bits of the CAM rules in the subset to bits in the corresponding reformatted subset, to produce a reformatted search key. The search key formatting circuit is also configured to input the reformatted search key to the respective CAM circuit storing the reformatted subset.

An apparatus is also disclosed that includes a plurality of content addressable memory (CAM) circuits. A memory configuration circuit in the apparatus is configured to group a set of N-bit ternary CAM rules into a plurality of subsets. For each of the subsets, the memory configuration circuit reformats CAM rules in the subset for storage in a respective one of the plurality of CAM circuits configured to store CAM rules having less than N ternary bits or configured for prefix match. The memory configuration circuit stores the reformatted subset in the respective CAM circuit. The memory configuration circuit also configures a search key formatting circuit configured to reformat a received search key for each of the plurality of subsets to produce a respective reformatted search key. The reformatting of the search key for each one of the subsets reformats the search key according to a mapping of bits of the subset to bits of the reformatted subset derived therefrom. The search key formatting circuit is configured to input the respective reformatted search key to the CAM circuit storing the reformatted subset. The apparatus also includes an ID translation circuit. The ID translation circuit is configured to, in response to one of the respective CAM circuits outputting a local ID for a matching CAM rule, translate the local ID to a unique global ID for the matching rule in the set of CAM rules.

Other features will be recognized from consideration of the Detailed Description and Claims, which follow.

BRIEF DESCRIPTION OF THE DRAWINGS

Various aspects and features of the invention will become apparent upon review of the following detailed description and upon reference to the drawings, in which.

DETAILED DESCRIPTION

Figure 1:
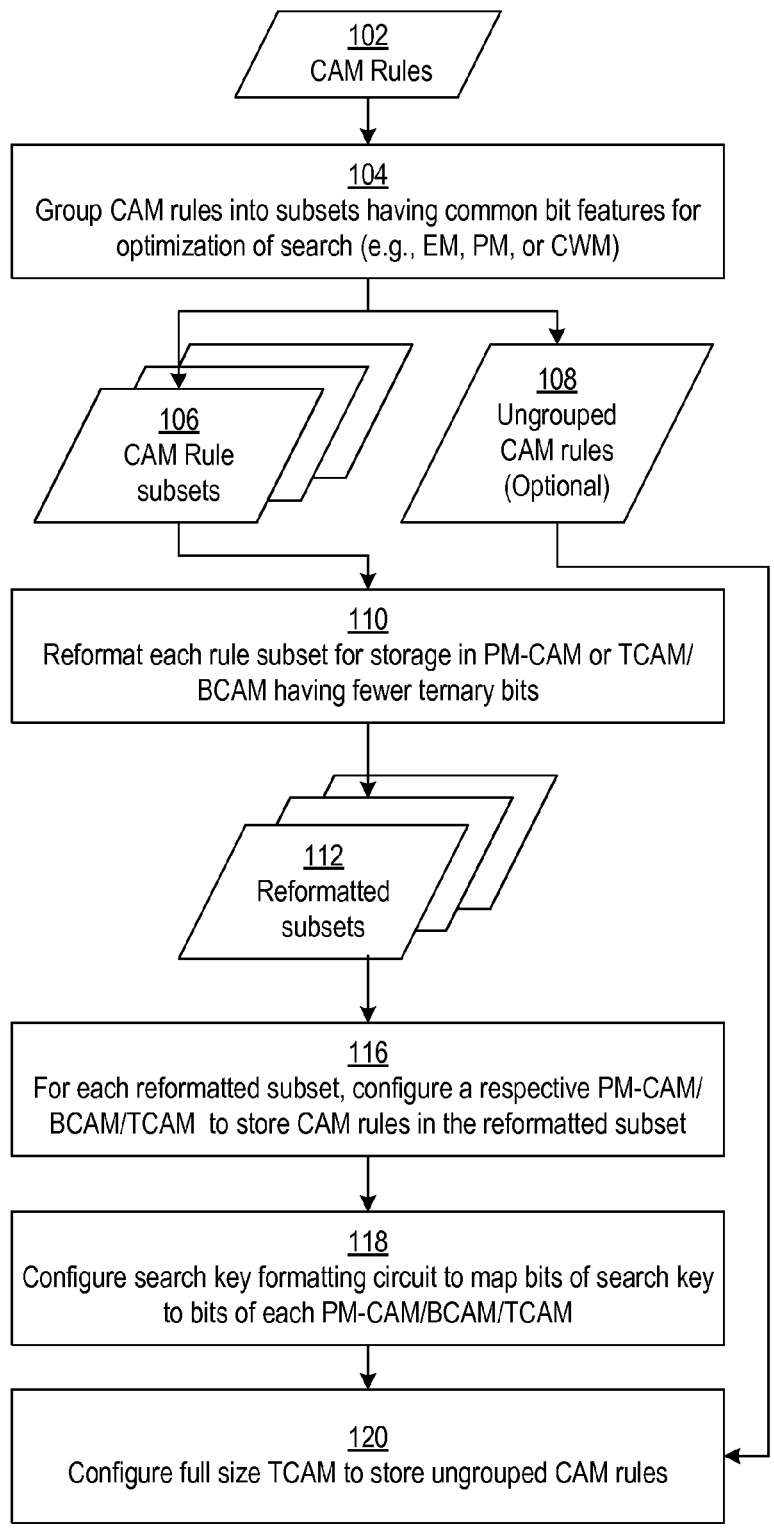
FIG. 1 shows a process for optimizing CAM storage via grouping of CAM rules.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

TCAM circuits are often used in networking devices for searching a set of ternary CAM rules simultaneously. However TCAM is generally expensive to implement and power inefficient. TCAM sizes are typically limited to a few thousand TCAM rule entries because TCAM requires more circuit area and power per rule entry in comparison to RAM. For instance, some previous TCAM circuits required about 30 times more area per bit of storage in comparison to SRAM. The higher cost of TCAM is primarily due to the additional circuitry, needed to store and search ternary values in each bit of the CAM rule, which may be more than 6 times larger than that of a SRAM chip of equivalent capacity.

In some implementations, TCAM rules are decomposed for storage using several smaller CAM circuits having lower cost per CAM rule entry. Lower cost CAM circuits may include for example, binary CAM (BCAM) circuits configured to store CAM rules without wildcard bits, narrower CAM circuits configured to store CAM rules having fewer bits or fewer ternary bits, or CAM circuits optimized to search CAM rule entries using a particular search algorithm (e.g., prefix match search).

In some implementations, a set of CAM rules are grouped into subsets for storage in respective CAM circuits configured for prefix match. For instance, the CAM rules may be grouped to form the largest subsets that can be respectively reordered (bitwise) to place all wildcard bits in the least significant bit positions. Reordering of bits to place all wildcard bits in the least significant bit positions allows the resulting CAM rules to be searched using a prefix match search algorithm.

As an illustrative example, TABLE 1 shows a set of six CAM rules R1, R2, R3, R4, R5, and R6, that may be grouped into subsets for storage in lower cost CAM circuits. For each CAM rule, bit values are shown in the second column of TABLE 1. A respective wildcard mask for each CAM rule is shown in the third column of TABLE 1. For each bit of the CAM rule, the wildcard mask includes a respective bit set to a logical 0 if the bit of the CAM rule has a wildcard value and set to a logical 1 if the bit of the CAM rule has a non-wildcard value.

In this example, bits b0, b1, b2, and b3 in each of CAM rules R2, R4, and R5 may be rearranged in the order b0, b3, b1, and b2 to place wildcard bits (*) in each of the CAM rules R2, R4, and R5 in the least significant bit positions. For instance, CAM rule R2 is changed from bit values 10*1 to 110* as a result of the above described rearrangement. Similarly, bits of CAM rules R3 and R6 may be rearranged in the order b1, b2, b0, b3 to place wildcard bits in each of the CAM rules R3 and R6 in the least significant bit positions. Processes for grouping of CAM rules for storage in one or more CAMs configured for prefix match search is discussed in more detail with reference to FIGS. 4, 5, and 6. For ease of reference a CAM circuit configured for prefix match may be referred to as a prefix-match CAM (PM-CAM).

TABLE 1

| Rule ID | Rule Bits (b0, b1, b2, b3) | Wildcard mask |
| --- | --- | --- |
| R1 | 01** | 1100 |
| R2 | 10*1 | 1101 |
| R3 | *00* | 0110 |
| R4 | 1**0 | 1001 |
| R5 | 0**1 | 1001 |
| R6 | 010* | 1110 |

Alternatively or additionally, some implementations may group the set of CAM rules into subsets for storage in respective CAM circuits configured to store CAM rules with fewer ternary bits. For example, some implementations may group and format CAM rules into subsets for storage in CAM circuits configured for an exact match search. In an exact match search CAM rules do not include any wildcard bits. Because all bits of the CAM rules in the subset(s) have non-wildcard values, the CAM rules may be stored in a BCAM circuit and searched using an exact match, which requires lower implementation cost in comparison to circuitry (e.g., TCAM) for ternary match searches.

As another example, CAM rules may be grouped into a subset such that each CAM rule in the subset has the wildcard values in the same bit positions. For ease of reference, bits of CAM rules having a wildcard value in each CAM rule of a subset may be referred to as a common wildcard bits of the subset. Bits of CAM rules having a wildcard value in some but not all CAM rules of a subset may be referred to as a non-common wildcard bits of the subset. Bits of CAM rules having a non-wildcard value (e.g., logic 1 or logic 0) in all CAM rules of a subset may be referred to as a non-wildcard bits of the subset.

When all CAM rules in a subset have a wildcard value in the same bit, each CAM rule will always match that bit of an input search key. Accordingly, the common wildcard bits may be removed from the CAM rules in the subset without affecting correct operation of the CAM. Once the common wildcard bits are removed, the CAM rules may be stored in a BCAM circuit and searched using exact match search. As an illustrative example, CAM rules R4 and R5 in TABLE 1 each have wildcard values in the same bits b1 and b2. CAM rules R4 and R5 may be reformatted to remove b1 and b2, thereby allowing bits b0 and b3 to be stored in a 2-bit wide BCAM and searched using exact match. Processes for grouping of CAM rules for storage in BCAMs and searching using exact match is discussed in more detail with reference to FIGS. 7 and 8.

In some implementations, CAM rules may be grouped into subsets for confined wildcard match search, where non-common wildcard bits are confined to a subset of bit positions in each of the CAM rules. Confining non-common wildcard bits to a subset of bit positions allows CAM rules in the subset to be stored and searched using a combination of smaller TCAM and BCAM circuits that require less overall memory for storage of the CAM rules. As previously explained, CAM rules can be reformatted to remove common wildcard bits. Non-common wildcard bits may be stored in a smaller TCAM having a bit-width equal to the number of non-wildcard bits. For instance, non-wildcard bits of the CAM rules in the set may be stored, for example, in BCAM and searched using exact match. Processes for grouping of CAM rules for storage in search in CAMs configured for confined wildcard search discussed in more detail with reference to FIG. 9.

Different subsets of the CAM rules may be configured for storage and/or search using different ones of prefix match, exact match, confined wildcard match, and/or ternary match to minimize overall cost of the CAM circuits for storage of the CAM rules. The cost of a CAM circuit can be quantified based on various criteria including, for example, die area or RAM memory requirements. In the context of ASIC applications, die area is a primary cost factor. Generally, the die area to implement one bit of a CAM circuit configured for exact match search is approximately the same as the die area to implement one RAM bit. One bit of a CAM circuit configured for prefix match requires approximately the same area as two RAM bits. One bit of a TCAM circuit requires approximately six times the die area needed to implement one RAM bit. In the context of a programmable integrated circuit (IC), having a set of programmable resources that may be configured to implement various circuits, RAM memory usage is a primary cost factor. Generally in a programmable IC, each bit of CAM circuit configured for exact match search requires approximately 1 RAM bit. Each bit of CAM circuit configured for prefix match search requires approximately 4 RAM bits. Each bit of TCAM circuit that is configured for wildcard match requires approximately 72 RAM bits.

In some implementations, the grouping of CAM rules may be limited to a maximum number of subsets. Depending on the bit values of the CAM rules, it may not be possible to group all of the CAM rules into the maximum number of subsets. In some implementations, a wildcard bit may be removed from an ungrouped CAM rule by replacing the ungrouped CAM rule with a pair of CAM rules, which is also referred to as "rule expansion." A first CAM rule of the pair replaces the wildcard bit with a logic 1 and a second CAM rule of the pair replaces the wildcard bit with a logic 0. Though the number of CAM rules is increased by expansion, the overall cost to store the resulting pair of CAM rules in a CAM(s) optimized for prefix match search, exact match search, or confined wildcard match search may be less than the cost to store the original CAM rule in a full-size TCAM. In some implementations, an ungrouped CAM rule may be expanded to $2^D$ new rules by replacing D wildcard bits with all possible combinations of D binary bits. For example, three wildcard bits (***) can be replaced with 000, 001, 010, 011, 100, 101, 110 and 111.

Turning now to the figures, FIG. 1 shows a process for optimized CAM storage via grouping of CAM rules. At block 104, a set of CAM rules 102 are grouped into subsets 106 having common bit features for optimizing storage and/or search of CAM rules, for example, using prefix match, exact match, and/or confined wildcard match. In some implementations, one or more CAM rules 108 may remain ungrouped following block 104. At block 110, each of the CAM rule subsets 106 is reformatted, for storage in a PM-CAM or in a TCAM or BCAM having fewer ternary bits than the CAM rules in the set 102, to produce a respective reformatted subset 112. For each reformatted subset 112, a respective PM-CAM, BCAM or narrower TCAM is configured at block 116 to store the CAM rules of the reformatted subset. At block 118, a search key formatting circuit is configured to remap bits of a search to bits of each CAM configured to store one of the reformatted subsets 112. At block 120, a full size TCAM, having a bit-width equal to the number of bits in each of the ungrouped CAM rules, is configured to store the ungrouped CAM rules 108.

Figure 2:
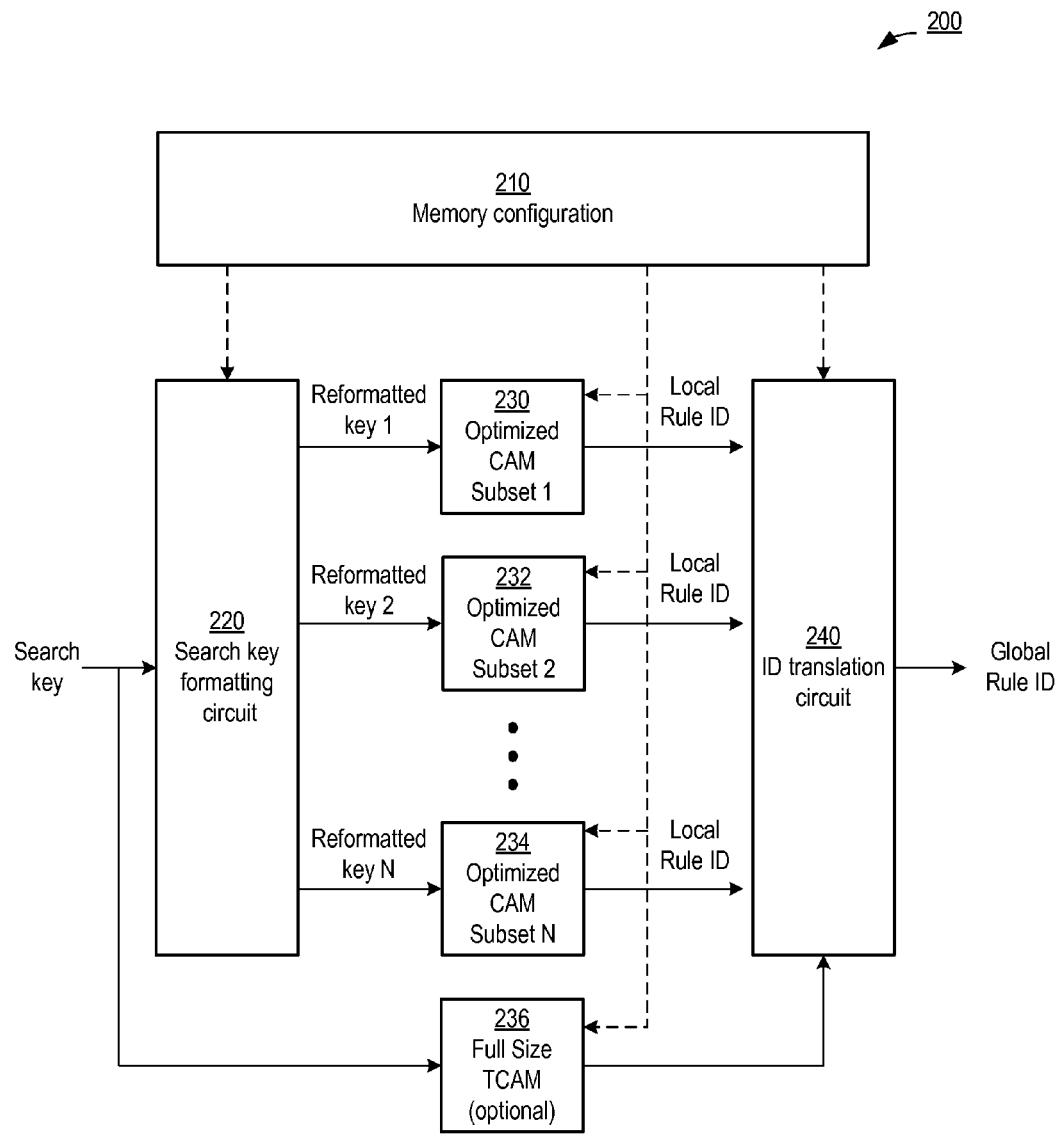
FIG. 2 shows a CAM memory arrangement for searching multiple subsets of CAM rules.

FIG. 2 shows a CAM memory arrangement 200 for searching multiple subsets of CAM rules. The CAM memory arrangement 200 includes a number of CAM circuits 230, 232, and 234 for storage of respective subsets of CAM rules. As previously described, the CAM circuits 230, 232, and 234 may be optimized for storage and search using, for example, prefix match, exact match, and/or confined wildcard match. In this example, the CAM memory arrangement 200 also includes a full size TCAM 236 for storage of any CAM rules that could not be grouped by the memory configuration circuit for storage in one of the optimized CAM circuits 230, 232, and 234.

In this example, CAM memory arrangement 200 includes a memory configuration circuit 210 configured to group a set of CAM rules into a plurality of subsets for storage in respective ones of the CAM circuits 230, 232, and 234. The memory configuration circuit 210 reformats CAM rules in each subset for optimized storage and search using a particular type of CAM search (e.g., prefix match, exact match, and/or confined wildcard match). As previously discussed, reformatting may include, for example, removing a bit having a wildcard value for every CAM rule in the subset and/or reordering bits in the CAM rules in the subset. The memory configuration circuit 210 is configured to store each reformatted subset in a respective one of the CAM circuits 230, 232, and 234.

In some implementations, each CAM circuit may include, for example, a search engine configured to store and search CAM rules in a respective portion of random access memory (RAM). In some implementations, one or more of the CAM circuits 230, 232, and 234 may be configured to search CAM rules using a particular type of CAM search (e.g., prefix match, exact match, and/or confined wildcard match). Additionally or alternatively, one or more of the CAM circuits 230, 232, 234, and 236 may be reconfigurable (e.g., by the memory reconfiguration circuit 210) to adjust the type of CAM search performed by the CAM circuit, bit width of CAM rules stored by the CAM circuit, and/or number of CAM rules stored by the CAM circuit.

The CAM memory arrangement 200 also includes a search key formatting circuit 220 that is configurable by the memory configuration circuit 210 to remap bits of an input search key for each of the CAM circuits 230, 232, and 234 to produce a respective reformatted search key. More specifically, for each CAM circuit, bits of the input search key are reordered/removed according to a respective mapping of bits in the original subset of CAM rules to bits of the reformatted subset stored in the CAM circuit. The search key formatting circuit 220 inputs each reformatted search key to a respective one of the CAM circuits 230, 232, and 234.

The CAM circuits 230, 232, 234, and 236 are each configured to output a rule ID in response to locating a CAM rule that matches a reformatted search key input to the CAM circuit. Each rule ID uniquely identifies the CAM rule(s) within the subset of CAM rules stored in the local CAM circuit. The CAM memory arrangement 200 includes an ID translation circuit 240 configured to convert rule IDs from a local rule ID to a global rule ID. The global rule ID uniquely identifies each matching CAM rule within the entire set of CAM rules stored in the CAM circuits 230, 232, 234, and 236. In some implementations, the mapping of a local rule ID to a global rule ID may be set by the memory configuration circuit 210 when the CAM rule is stored by the memory configuration circuit 210 in a particular one of the CAM circuits 230, 232, 234, and 236.

The memory configuration circuit 210 in FIG. 2 may be implemented using various circuits. For example, the memory configuration circuit 210 may include a computing arrangement (e.g., a microcontroller) programmed to perform the process shown in FIG. 1. Additionally or alternatively, in some other implementations, the memory configuration circuit 210 may include one or more ASIC circuits configured to perform, for example, one or more of the operations shown in FIG. 1. In some implementations, the memory configuration circuit 210 is included in the CAM memory arrangement 200, as shown in FIG. 2. In some implementations, the memory configuration circuit may include an external device communicatively coupled to the CAM memory arrangement 200 for configuration of the CAM circuits 230, 232, 234, and 236, search key formatting circuit 220, and/or ID translation circuit 240. As an illustrative example, in some applications, the CAM memory arrangement 200 may be implemented using programmable resources on a programmable IC (e.g., a field programmable gate array). The process shown in FIG. 1, may be performed by a computer aided design tool to optimize storage of the CAM memory arrangement to be implemented on the programmable IC for a known set of CAM rule entries. After grouping and reformatting CAM rules into reformatted subsets, the computer aided design tool may generate a set of configuration data to program programmable resources of the programmable IC to implement CAM circuits 230, 232, 234, and 236 optimized for storing the respective reformatted subsets.

Figure 3:
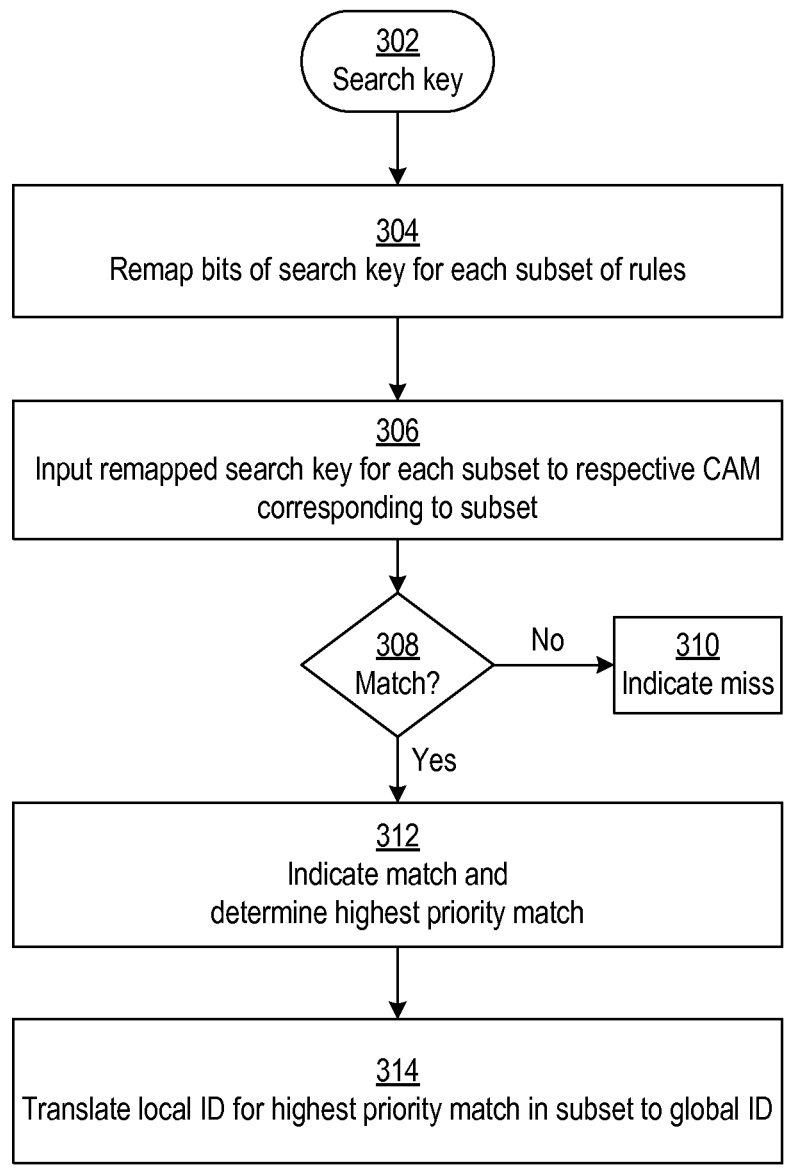
FIG. 3 shows an example process for performing a CAM search across multiple subsets.

FIG. 3 shows an example process of performing a CAM search across multiple subsets of CAM rules. In response to an input search key 302, bits of the search key are respectively remapped for each subset of CAM rules at block 304 to produce a respective remapped search key. At block 306, each remapped search key is input to the respective one of the CAM circuits corresponding to the subset of CAM rules. If none of the CAM circuits indicates a match, decision block 308 directs the process to set an output signal to indicate a miss at block 310. If one or more of the CAM circuits indicate a match, decision block 308 directs the process to block 312. At block 312, the output signal is set to indicate that a match has been found and the matching CAM rule having the highest priority is determined. Priority may be determined, for example, based on the number of wildcard bits in each of the matching CAM rules. For instance, a matching CAM rule having some number of wildcard bits may be given priority over a matching CAM rule having a greater number of wildcard bits. At block 314, a local ID for the highest priority CAM rule is translated to a global ID that uniquely identifies the CAM rule in a global set of rules.

Figure 4:
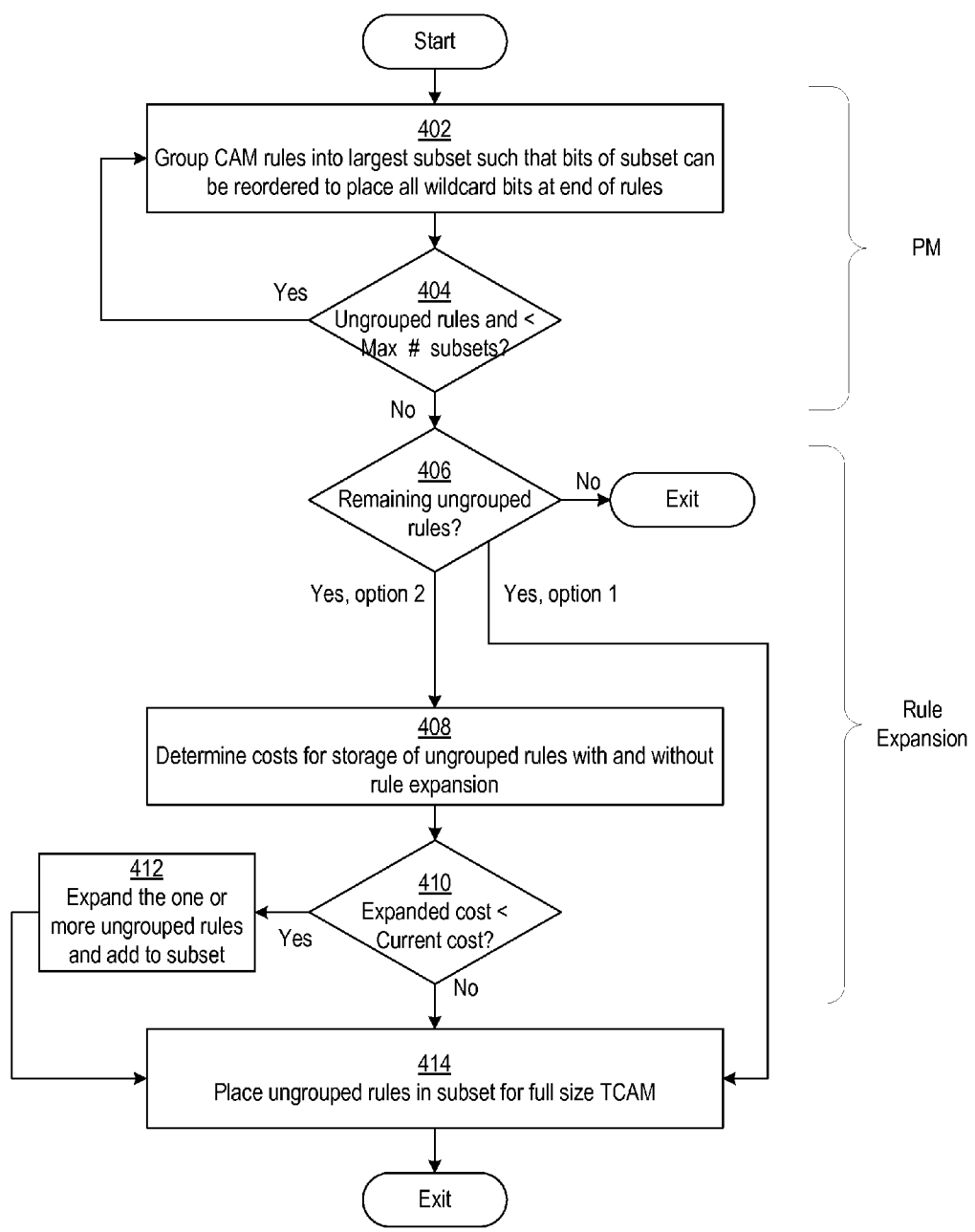
FIG. 4 shows an example process for grouping CAM rules for prefix match search and optional rule expansion.

FIG. 4 shows an example process for grouping CAM rules for prefix match optimization and optional rule expansion. At block 402, CAM rules are grouped into the largest subset of the CAM rules that can all be reordered (bitwise) to place all wildcard bits in each of the CAM rules in the least significant bit positions of the CAM rule.

If there are remaining ungrouped CAM rules and the number of subsets is less than a maximum number of subsets, decision block 404 directs the process to repeat grouping of CAM rules at block 402 for the next largest subset of the ungrouped CAM rules that can all be reordered to place all wildcard bits in the least significant bit positions. The maximum number of subsets may be determined, for example, based on a number of CAM search engine circuits available to implement respective CAMs for the subsets. Otherwise, if there are no remaining ungrouped CAM rules or the number of subsets is greater than the maximum number of subsets, decision block 404 directs the process to decision block 406.

If there are no remaining ungrouped CAM rules, decision block 406 directs the process to exit. In a first implementation, decision block 406 directs the process to block 414 if there are remaining ungrouped CAM rules. At block 414, ungrouped CAM rules are placed in a subset for storage in a full size TCAM circuit.

In a second implementation, the process attempts to expand one or more ungrouped CAM rules for grouping into the subsets. In the second implementation, decision block 406 directs the process to block 408 if there are no remaining ungrouped rules. At block 408, the costs of storing each ungrouped CAM rule with rule expansion and without rule expansion is determined. The cost may be determined, for example, based on the die area or RAM memory requirements of the CAM circuit used to store the CAM rule(s), as previously described.

If the cost of storing one or more CAM rules with rule expansion is less than the current cost of the CAM rules, decision block 410 directs the process to expand the CAM rules at block 412 and add the expanded rules to matching subsets. Otherwise, decision block 410 directs the process to bypass block 412 and proceed to block 414. At block 414, remaining ungrouped CAM rules are placed in a subset for storage in a full size TCAM.

Figure 5:
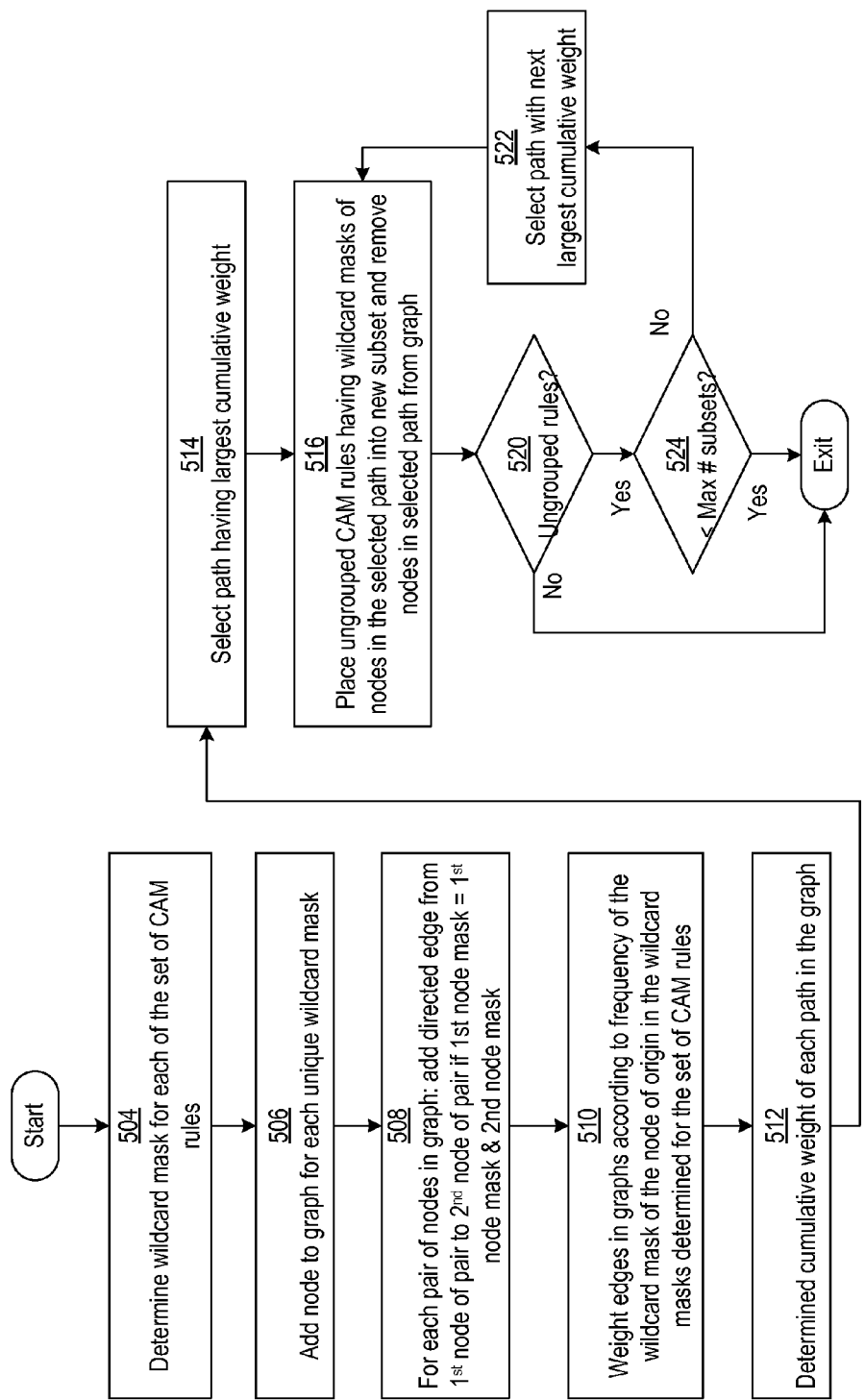
FIG. 5 shows an example process for identifying CAM rules that can be reordered bitwise for prefix match search.

Different implementations may use different processes to identify CAM rules for grouping into subsets at blocks 402 and 404. FIG. 5 shows one example of a process for selecting CAM rules that can be reordered bitwise for prefix match search. At block 504, a wildcard mask is determined for each of a set of CAM rules. At block 506, a respective node is added to a graph for each unique wildcard mask. Edges are also added to the graph at block 508. For each pair of nodes in the graph, a directed edge is added from a first node of the pair to a second node of the pair if the mask for the first node is equal to a bitwise AND of the wildcard masks of the first and second nodes. At block 510, the edges are assigned weights according to a number of occurrences of the wildcard mask for the node at the source of the edge. The number of occurrences of a particular wildcard mask is equal to the number of CAM rules that have the wildcard mask.

For each possible path in the graph, a cumulative weight is determined based on the weights assigned to edges in the path at block 512. At block 514, a path having the largest cumulative weight is selected. At block 516, ungrouped CAM rules having wildcard masks of nodes in the selected path are added to a new subset and nodes in the select path are removed from the graph. If there are no remaining ungrouped CAM rules, decision block 520 directs the process to exit. Otherwise, decision block 520 directs the process to decision block 524. If the number of subsets is less than the maximum number of subsets, decision block 524 directs the process to select the path with the next largest cumulative weight at block 522. The process then repeats placement of ungrouped CAM rules having masks matching nodes in the selected path at block 516. The process repeats in this manner until there are no remaining ungrouped CAM rules at decision block 520 or there is the maximum number of subsets at decision block 524.

Figure 6:
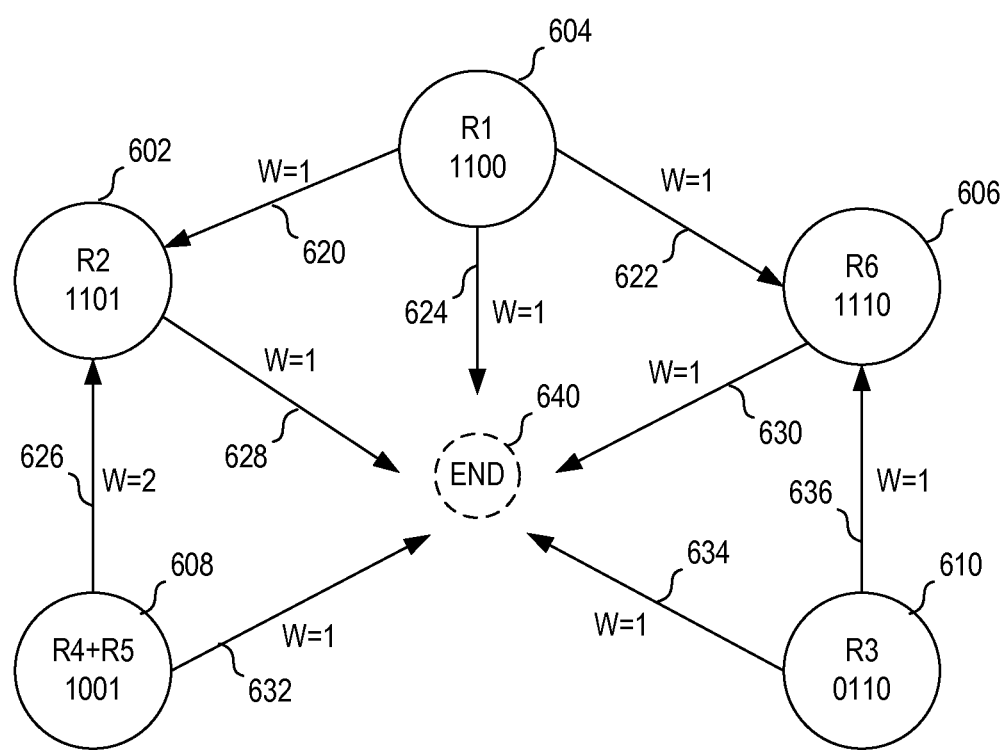
FIG. 6 shows an example graph for identifying subsets of CAM rules that can be reordered bitwise for prefix match search.

FIG. 6 shows an example graph for identifying subsets of CAM rules that can be reordered bitwise for prefix match search. The graph may be generated, for example, at blocks 508, 510, and 512 in FIG. 5 for the set of CAM rules R1, R2, R3, R4, R5, and R6 shown in TABLE 1. As described with reference to block 508, the graph includes a node for each unique wildcard mask for the set of CAM rules. In this example, the graph includes five nodes 602, 604, 606, 608, and 610, for the five unique wildcard masks in TABLE 1.

For each pair of nodes, a directed edge (e.g., 620, 622, 626, or 636) is added from a first node of the pair to a second node of the pair if mask (first node)<mask (second node), where A<B if A=A & B. Directed edges 624, 628, 630, 632, and 634 are also added from each node to an endpoint 640. Edges are weighted according to the number of occurrences of the wildcard mask of the first node for each edge. As previously described, subsets may be selected based on cumulative weight of edges in respective paths in the graph. TABLE 2 shows a sorted list of cumulative weight for each path in the graph.

As described with reference to block 514, path P1 having the largest cumulative weight may be selected for the first subset. CAM rules R4, R5, and R2, having wildcard masks equal to wildcard masks 1001 and 1101 in path P1, are added to the first subset. Reordering bits b0, b1, b2, and b3 of the wildcard masks 1001 and 1101 to b0, b3, b1, b2 places wildcard bits at the end of the CAM rules having masks 1001 and 110. Nodes for masks 1001 and 1101 are removed from the graph, thereby eliminating paths P1, P2, P5, and P6.

TABLE 2

| PATH | Masks in path | Cumulative Weight |
|---|---|---|
| P1 | 1001 → 1101 → End | 3 |
| P2 | 1100 → 1101 → End | 2 |
| P3 | 1100 → 1110 → End | 2 |
| P4 | 0110 → 1110 → End | 2 |
| P5 | 1001 → End | 1 |
| P6 | 1101 → End | 1 |
| P7 | 1100 → End | 1 |
| P8 | 0110 → End | 1 |
| P9 | 1110 → End | 1 |

TABLE 3 shows the sorted list of TABLE 2 with paths P1, P2, P5, and P6 removed. As shown in TABLE 3, the path P3 becomes the next highest weight path in the sorted list and is selected for a second subset. CAM rules R1 and R6, having masks equal to masks 1100 and 1110 in selected path P3, are added to the second subset. In this case, wildcard bits of the wildcard masks 1100 and 1110 are already located at the end of the mask without any reordering. Nodes for masks 1100 and 1110 are removed from the graph, thereby eliminating paths P3, P4, P7, and P9. After which, path P8 is the only remaining path in the graph and is selected for the third subset. CAM rule R3 having a mask equal to the mask 0110 in the selected path, is added to the third subset.

TABLE 3

| PATH | Masks in path | Cumulative Weight |
|---|---|---|
| P3 | 1100 → 1110 → End | 2 |
| P4 | 0110 → 1110 → End | 2 |
| P7 | 1100 → End | 1 |
| P8 | 0110 → End | 1 |
| P9 | 1110 → End | 1 |

Figure 7:
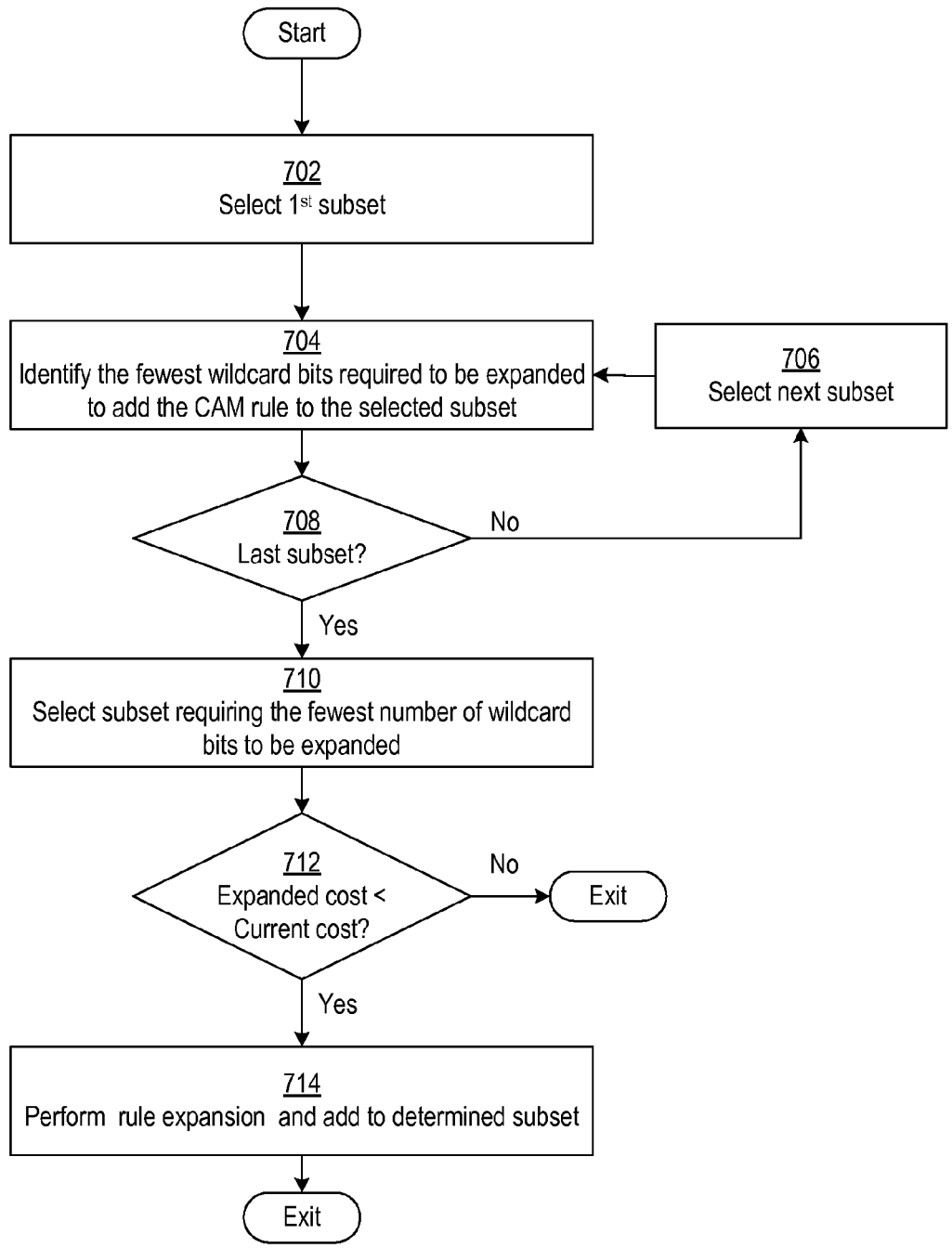
FIG. 7 shows an example process for rule expansion of CAM rules for placement in subsets configured for prefix match search.

FIG. 7 shows an example process for rule expansion of CAM rules for placement in subsets configured for prefix match search. At block 702, a first subset is selected. At block 704, the process identifies the fewest wildcard bits required to be expanded to add the CAM rule to the selected subset. Example 1 shows pseudocode for determining a smallest number of bits required to be expanded to add a rule r to an existing subset S configured for prefix match search. The pseudocode returns a wildcard mask for an expanded rule R(r) that is compatible with the subset S. If the selected subset is not the last of the subsets, decision block 708 directs the process to select the next subset at block 706 and return to decision block 704. Otherwise, decision block 708 directs the process to proceed to block 710. At block 710, the subset requiring the fewest number of wildcard bits to be expanded is selected. If the determined cost for expansion is less than the current cost for storing the CAM rule without expansion, decision block 712 directs the process to perform rule expansion and add the expanded rule to the determined subset at block 714. Otherwise, decision block 712 directs the process to exit.

```
1: Initialize mask(R(r)) ← mask (r)
2: for s ∈ S do
3:     if mask (R(r)) ≮ mask (s) then
4:         mask (R(r)) ← mask (R(r)) | mask (s)
5:     end if
6: end for
7: Return mask (R(r)).
```

Example 1

Figure 8:
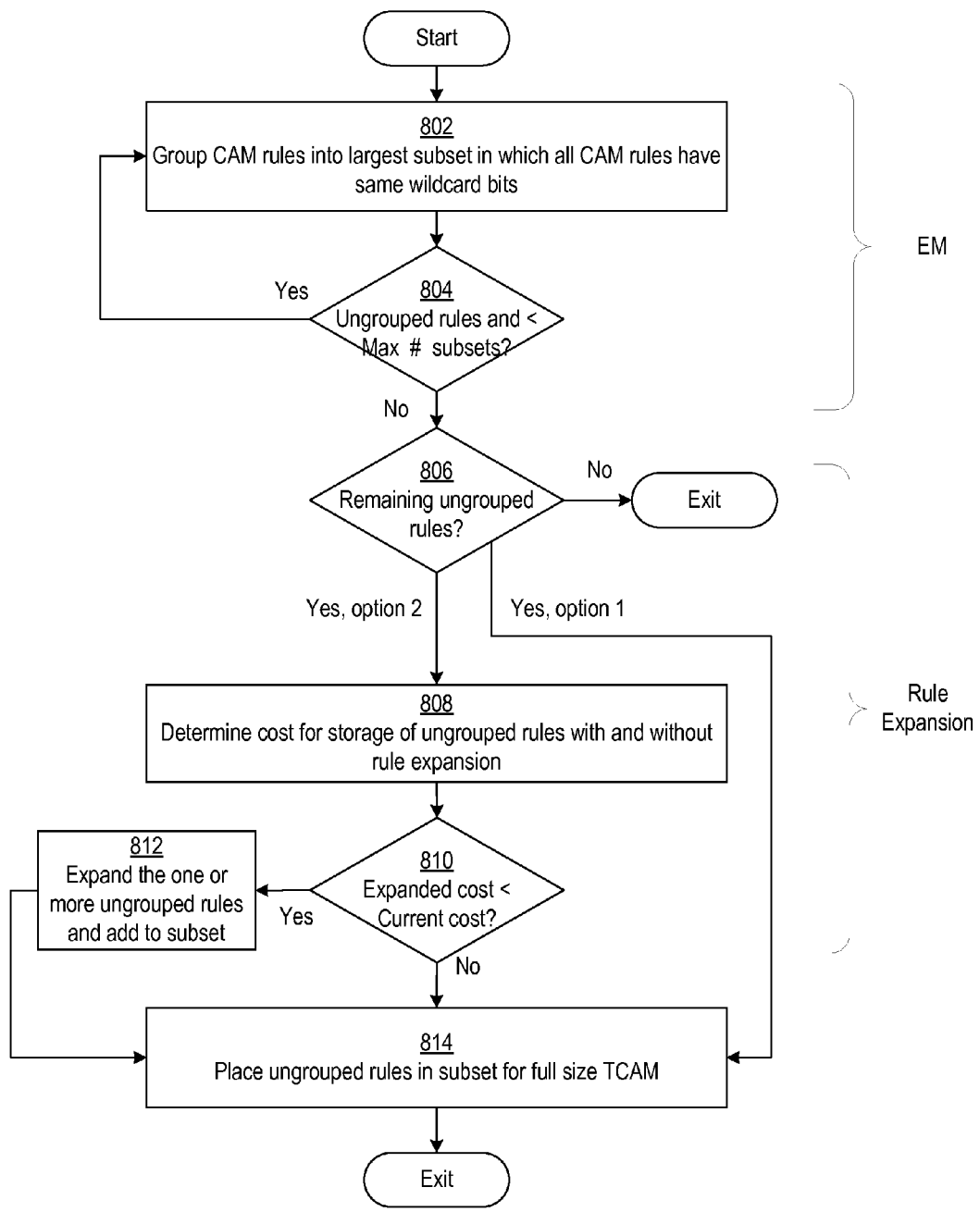
FIG. 8 shows a process for grouping CAM rules for exact match search and optional rule expansion.

FIG. 8 shows a process for grouping CAM rules for exact match optimization and optional rule expansion. At block 802, wildcard masks are determined for a set of CAM rules. If there are remaining ungrouped CAM rules and the number of subsets is less than a maximum number of subsets, decision block 804 directs the process to repeat grouping of CAM rules at block 802 for the next largest subset. Otherwise, decision block 804 directs the process to decision block 806. If there are no remaining ungrouped CAM rules, decision block 806 directs the process to exit. In a first implementation, decision block 806 directs the process to block 814 if there are remaining ungrouped CAM rules. At block 814, ungrouped CAM rules are placed in a subset for storage in a full size TCAM circuit.

In a second implementation, the process attempts to expand one or more ungrouped CAM rules for grouping into the subsets. In the second implementation, decision block 806 directs the process to block 808 if there are no remaining ungrouped CAM rules. At block 808, the cost of storing each ungrouped CAM rule with rule expansion and without rule expansion is determined. If the cost of storing one or more CAM rules with rule expansion is less than the current cost of the CAM rules, decision block 810 directs the process to expand the CAM rules at block 812 and add the expanded CAM rules to matching subsets. Otherwise, decision block 810 directs the process to bypass block 812 and proceed to block 814. At block 814, remaining ungrouped CAM rules are placed in a subset for storage in a full size TCAM.

Figure 9:
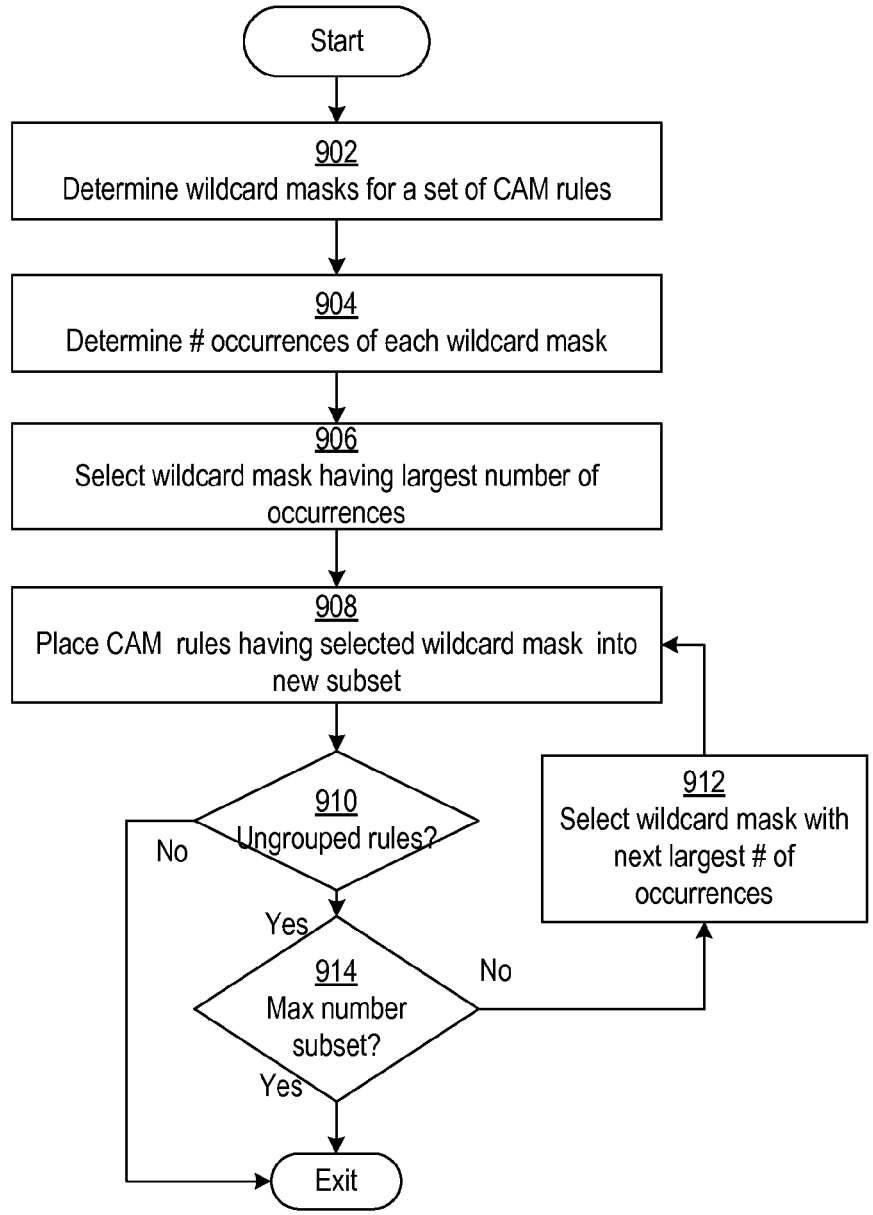
FIG. 9 shows an example process for selecting CAM rules for exact match search.

Different implementations may use various processes to identify CAM rules for grouping into subsets, at blocks 802 and 804. FIG. 9 shows an example process for selecting CAM rules for exact match search. At block 902, wildcard masks are determined for a set of CAM rules. At block 904, a number of occurrences of each wildcard mask is determined. The wildcard mask having the largest number of occurrences is selected at block 906. CAM rules having the selected wildcard mask are placed into a new subset at block 908. If there are no remaining ungrouped CAM rules, decision block 910 directs the process to exit. Otherwise, decision block 910 directs the process to decision block 914.

If the number of subsets is less than the maximum number of subsets, decision block 914 directs the process to select the wildcard mask with the next largest number of occurrences at block 912. The process then repeats placement of ungrouped CAM rules having the selected wildcard mask at block 908. The process repeats in this manner until there are no remaining ungrouped CAM rules at decision block 910 or there is the maximum number of subsets at decision block 914.

Figure 10:
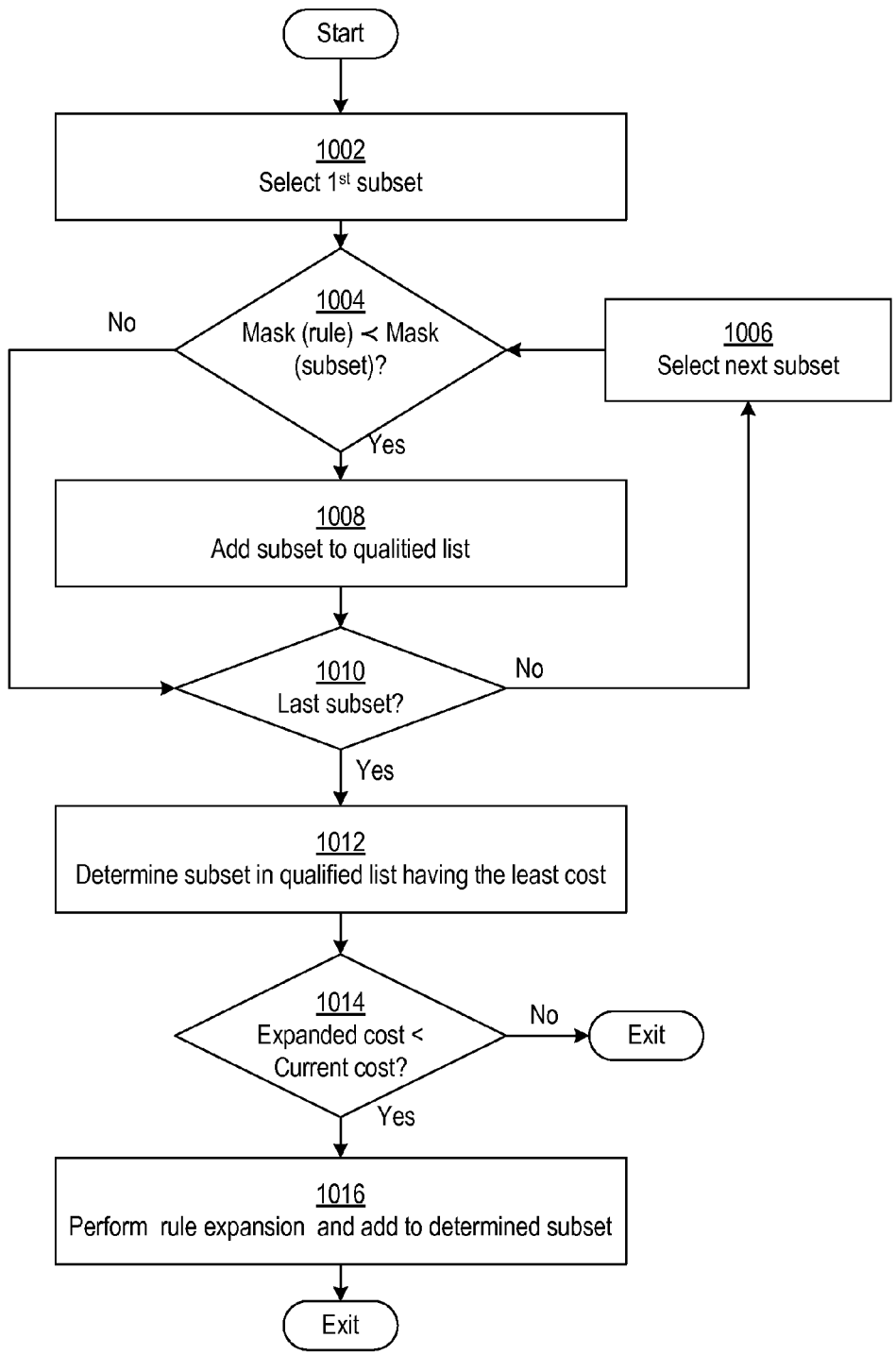
FIG. 10 shows an example process for rule expansion of CAM rules for placement in subsets configured for exact match search.

FIG. 10 shows an example process for rule expansion of CAM rules for placement in subsets configured for exact match. At block 1002, a first subset is selected. If mask (rule)<mask (subset), decision block 1004 directs the process to add the subset to a qualified list at block 1008. Otherwise, decision block 1004 directs the process to bypass block 1008. Mask (subset) may be determined, for example, by computing a bitwise OR of wildcard masks for the CAM rules in the subset. If the selected subset is not the last of the subsets, decision block 1010 directs the process to select the next subset at block 1006 and return to decision block 1004. Otherwise, decision block 1010 directs the process to proceed to block 1012. At block 1012, the process determines the subset in the qualified list that has the least cost for expansion. If the determined cost for expansion is less than the current cost for storing the CAM rule without expansion, decision block 1014 directs the process to perform CAM rule expansion and add the expanded CAM rule to the determined subset at block 1016. Otherwise, decision block 1014 directs the process to exit.

Figure 11:
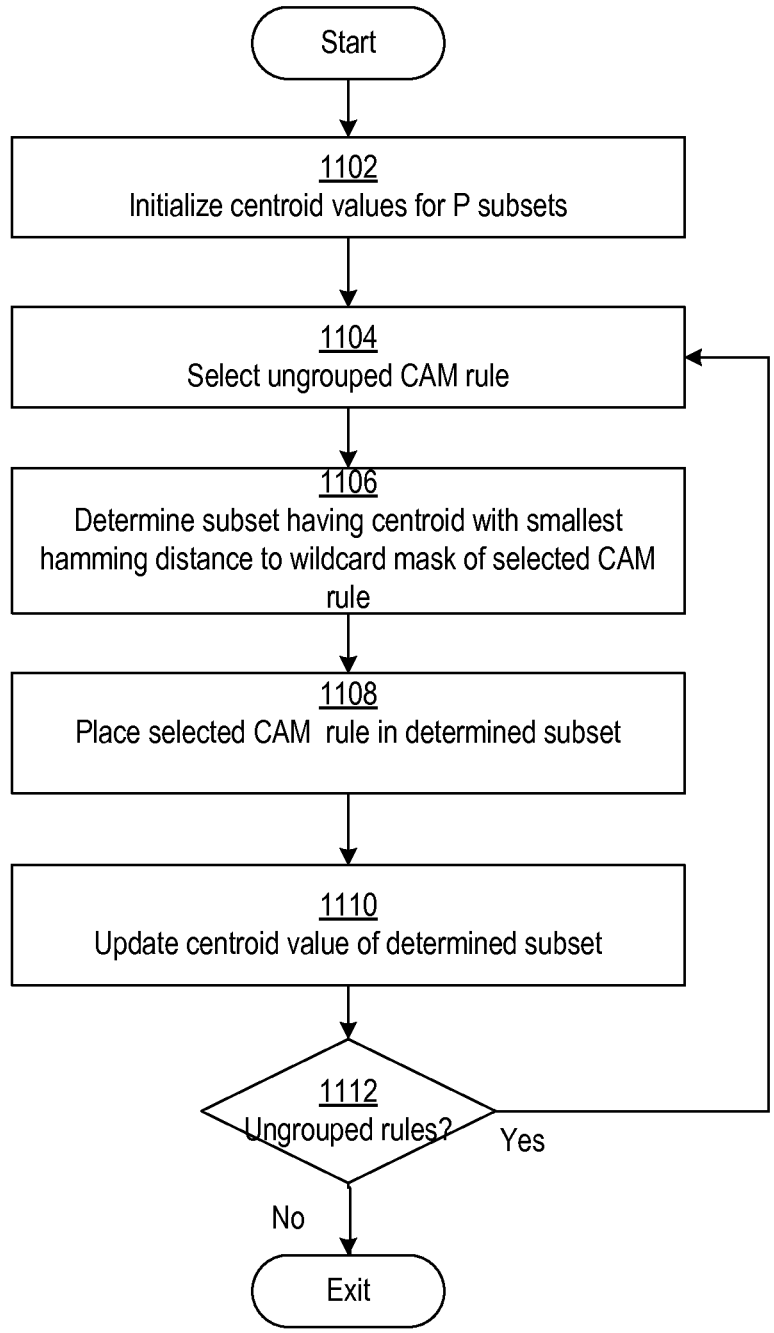
FIG. 11 shows an example process for grouping CAM rules for confined wildcard match search.

FIG. 11 shows an example process for grouping CAM rules for confined wildcard match search. At block 1102, centroid values are initialized for P subsets. Centroid values of the P subsets may be initialized to various values. As one example, centroid values for each subset may be set to a random wildcard mask. As another example, centroid values may be initialized to unique wildcard masks having the highest number of occurrences in the set of CAM rules. Centroid values may additionally or alternatively be initialized to unique wildcard masks having the lowest dissimilarity. The dissimilarity of a wildcard mask is the Hamming distance from the wildcard mask and other wildcard masks for the set of CAM rules. In some implementations, centroid values for the P subsets may be initialized using principle component analysis. For instance, P principal components may be determined for a set of wildcard masks corresponding to the set of CAM rules. Each principle component is a wildcard mask having only one set bit.

An ungrouped CAM rule is selected at block 1104. At block 1106, the subset having the centroid value with the smallest hamming distance to the wildcard mask for the selected CAM rule is determined. At block 1108, the selected CAM rule is placed in the determined subset. In this example, the centroid value for the determined subset is updated at block 1110 after adding each CAM rule to the subset. The centroid value may be updated, for example by performing a bitwise AND of the centroid value with a wildcard mask for the new CAM rule added to the subset. In some other implementations, rather than updating centroid values each time a CAM rule is added to a subset, centroid values may be updated after multiple CAM rules have been added. For instance, in some implementations, centroid values may be updated after all ungrouped CAM rules have been placed in the subsets.

In this example, if there are remaining ungrouped CAM rules following block 1110, decision block 1112 directs the process to select another ungrouped CAM rule at block 1104. The process then repeats steps performed at block 1106, 1108, and 1110 for the new selected CAM rule. The process repeats in this manner until there are no ungrouped rules at decision block 1112.

By placing CAM rules in subsets based on the Hamming distance of wildcard masks, the process minimizes the number of bits in each subset in which some but not all CAM rules have a wildcard value. As previously described, if all CAM rules in a subset have a non-wildcard value for a bit, the bit of the CAM rules may be stored and search using a BCAM. Moreover if all CAM rules in a subset have a wildcard value for a bit, the bit does not need to be stored or searched for the subset. By minimizing the number of bits that have both wildcard and non-wildcard values for CAM rules in the subset, the subset of CAM rules may be stored using fewer ternary bits and, therefore, less memory.

Figure 12:
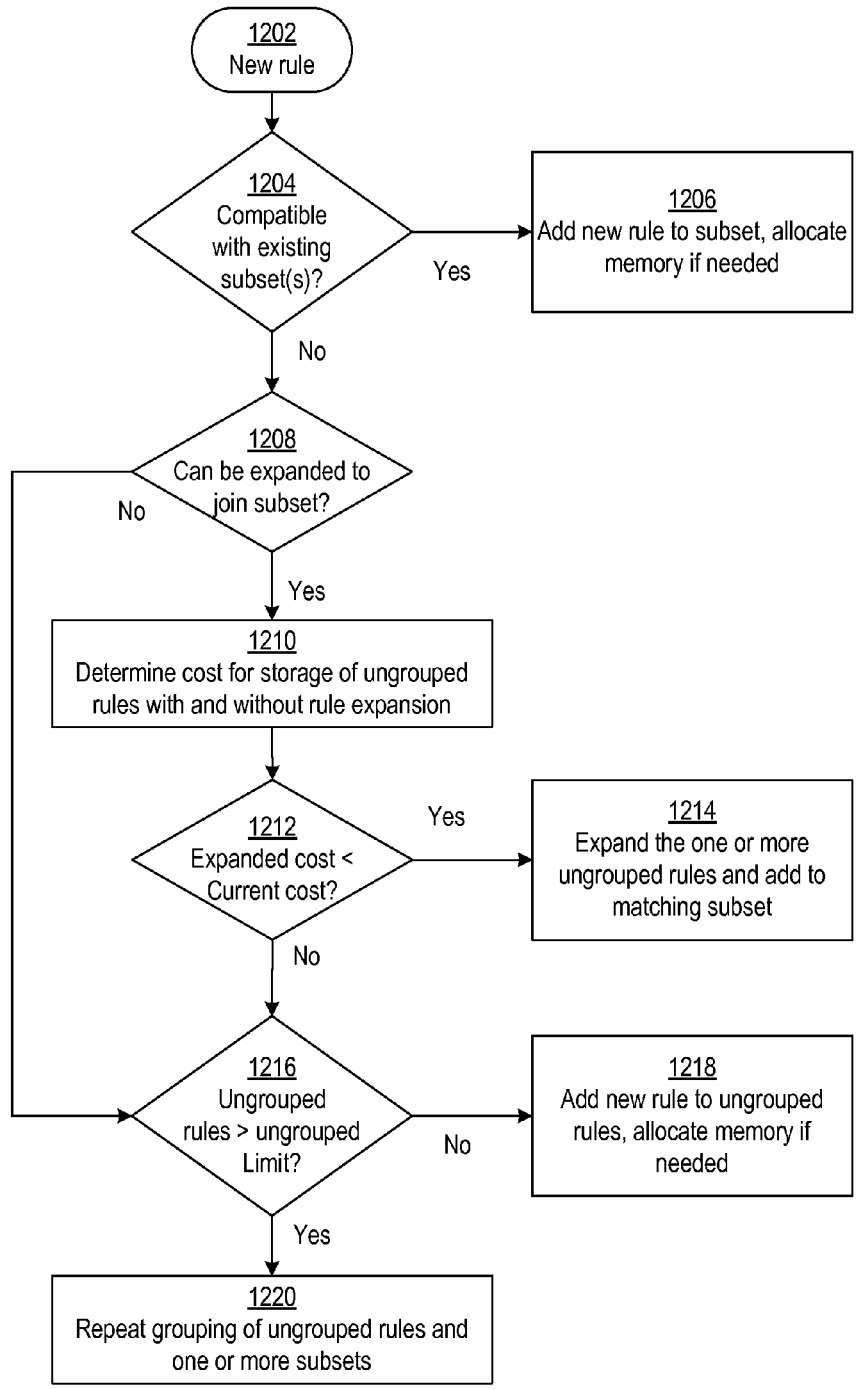
FIG. 12 shows an example process for adding additional rules in an existing plurality of subsets of CAM rules.

FIG. 12 shows an example process for adding additional CAM rules in an existing plurality of subsets of CAM rules. The process is initiated in response to the receipt of a new CAM rule 1202. If the CAM rule is compatible with an existing subset, decision block 1204 directs the process to add the CAM rule to the subset at block 1206. If necessary, additional memory may be allocated at block 1206 to increase the size of a CAM used to store the subset. If the CAM rule is not compatible with an existing subset, decision block 1204 directs the process to decision block 1208. If the CAM rule can be expanded to add the new CAM rule to the existing subset(s), decision block 1208 directs the process to block 1210. Otherwise, decision block 1208 directs the process to decision block 1216.

At block 1210, the cost of storing each ungrouped CAM rule with rule expansion and without rule expansion is determined. If the cost of storing one or more CAM rules with rule expansion is less than the current cost of the CAM rules, decision block 1212 directs the process to expand the CAM rules at block 1214 and add the expanded CAM rules to matching subsets. Otherwise, decision block 1212 directs the process to decision block 1216.

In some implementations, if the new CAM rule is not compatible with an existing subset and is not expanded, the new CAM rule will be stored with other ungrouped CAM rules in a full size TCAM at block 1218. In some implementations, the process may restrict a maximum number of CAM rule entries that can be stored in the full size CAM. In this example, if the number of ungrouped CAM rules is less than or equal to an ungrouped CAM rule limit, decision block 1216 directs the process to add the new CAM rule to the ungrouped CAM rules. If the number of ungrouped CAM rules exceeds the ungrouped CAM rule limit, decision block 1216 directs the process to repeat grouping of the ungrouped CAM rules and CAM rules in the subsets at block 1220. The grouping of the CAM rules may be repeated, for example, using the processes discussed with reference to FIGS. 4, 5, 6, 7, and/or 9.

Figure 13:
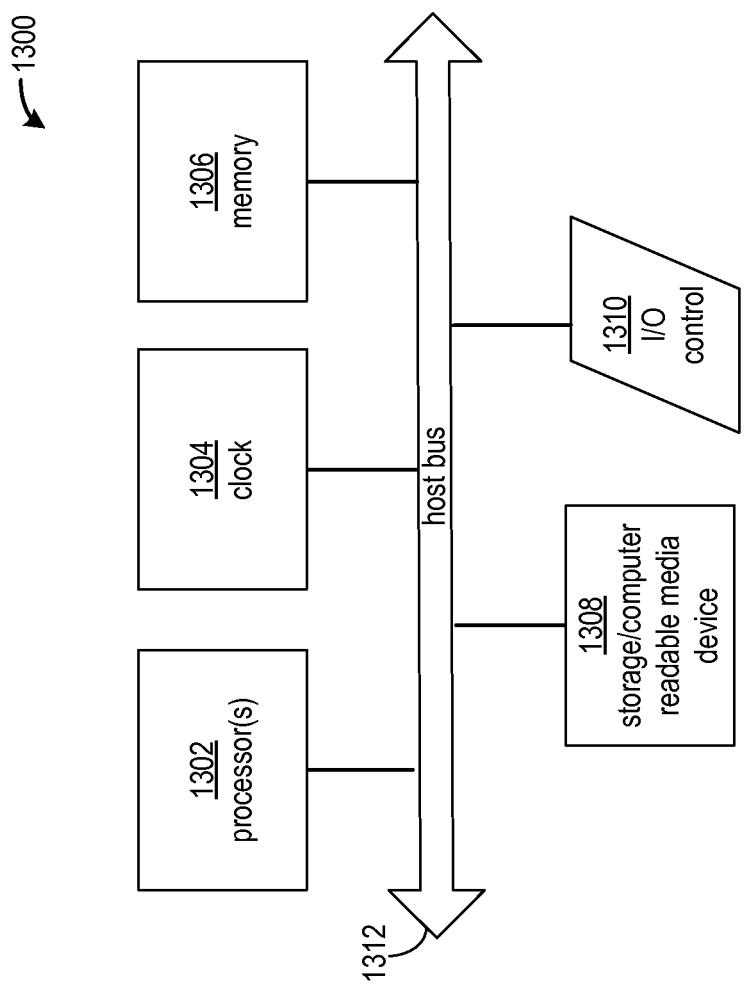
FIG. 13 shows an example computing system that may be adapted to implement the disclosed processes.

FIG. 13 shows a block diagram of an example computing arrangement that may be configured to implement the processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 1300 includes one or more processors 1302, a clock signal generator 1304, a memory arrangement 1306, a storage arrangement 1308, and an input/output control unit 1310, all coupled to a host bus 1312. The arrangement 1300 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 1302 may be one or more general purpose processors, or a combination of one or more general purpose processors and suitable co-processors, or one or more specialized processors (e.g., RISC, CISC, pipelined, etc.).

The memory arrangement 1306 typically includes multiple levels of cache memory, and a main memory. The storage arrangement 1308 may include local and/or remote persistent storage, such as provided by magnetic disks (not shown), flash, EPROM, or other non-volatile data storage. The storage unit may be read or read/write capable. Further, the memory arrangement 1306 and storage arrangement 1308 may be combined in a single arrangement.

The processor(s) 1302 executes the software in storage arrangement 1308 and/or memory arrangement 1306, reads data from and stores data to the storage arrangement 1308 and/or memory arrangement 1306, and communicates with external devices through the input/output control arrangement 1310. These functions are synchronized by the clock signal generator 1304. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

Figure 14:
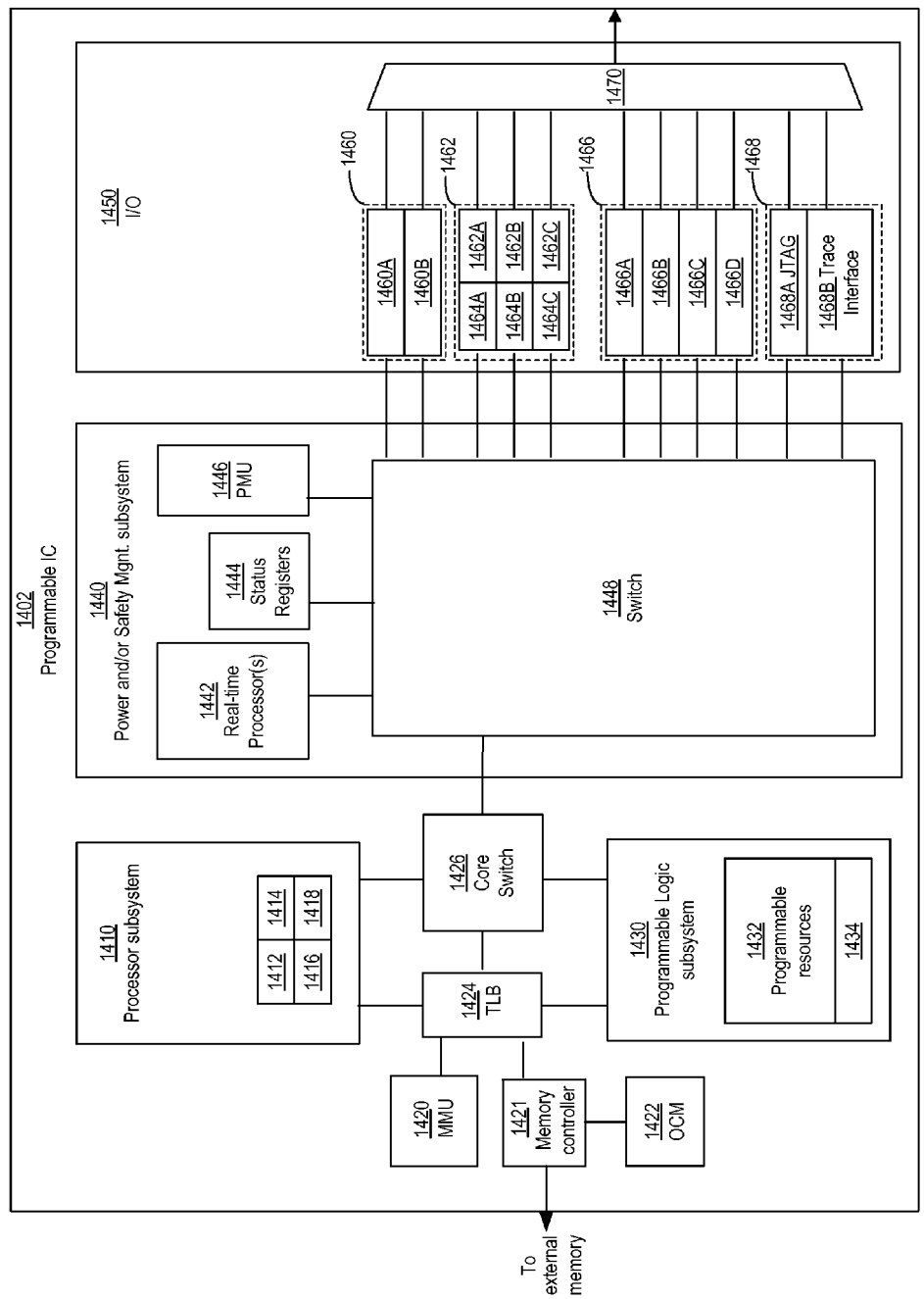
FIG. 14 shows an example programmable integrated circuit (IC) that may be configured to implement a TCAM.

FIG. 14 shows a programmable IC 1402 that may be configured in accordance with one or more implementations. The programmable IC may also be referred to as a System On Chip (SOC), which includes a processor subsystem 1410 and a programmable logic subsystem 1430. The processor subsystem 1410 may be programmed to implement a software portion of the user design, via execution of a user program. The program may be specified as part of a configuration data stream or may be retrieved from an on-chip or off-chip data storage device. The processor subsystem 1410 may include various circuits 1412, 1414, 1416, and 1418 for executing one or more software programs. The circuits 1412, 1414, 1416, and 1418 may include, for example, one or more processor cores, floating point units (FPUs), an interrupt processing unit, on chip-memory, memory caches, and/or cache coherent interconnect.

The programmable logic subsystem 1430 of the programmable IC 1402 may be programmed to implement a hardware portion of a user design. For instance, the programmable logic subsystem may include a number of programmable resources 1432, which may be programmed to implement a set of circuits specified in a configuration data stream. The programmable resources 1432 include, for example, programmable interconnect circuits, programmable logic circuits (e.g., configurable latch circuits), and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 1432 may be programmed by loading a configuration data stream into the configuration memory cells, which define how the programmable interconnect circuits and programmable logic circuits are configured. For example, setting a configuration memory cell for a configurable latch to a first value may direct the configurable latch to operate as a single-edge-driven latch. Setting the configuration memory cell to a second value may direct the configurable latch to operate as a double-edge-driven latch. The collective states of the individual memory cells then determine the function of the programmable resources 1432. The configuration data can be read from memory (e.g., from an external PROM) or written into the programmable IC 1402 by an external device. In some implementations, a configuration controller 1434 included in the programmable logic subsystem 1430 may program the programmable resources, in response to powering on the programmable IC, by retrieving configuration data from a non-volatile memory coupled to the programmable IC and loading the configuration data into the configuration memory cells. In some other implementations, the configuration data may be loaded into the configuration memory cells by a start-up process executed by the processor subsystem 1410.

The programmable IC 1402 may include various circuits to interconnect the processor subsystem 1410 with circuitry implemented within the programmable logic subsystem 1430. In this example, the programmable IC 1402 includes a core switch 1426 that can route data signals between various data ports of the processor subsystem 1410 and the programmable logic subsystem 1430. The core switch 1426 may also route data signals between either of the programmable logic or processing subsystems 1410 and 1430 and various other circuits of the programmable IC, such as an internal data bus. Alternatively or additionally, the processor subsystem 1410 may include an interface to directly connect with the programmable logic subsystem-bypassing the core switch 1426. Such an interface may be implemented, for example, using the AMBA AXI Protocol Specification (AXI) as published by ARM.

In some implementations, the processor subsystem 1410 and the programmable logic subsystem 1430 may also read or write to memory locations of an on-chip memory 1422 or off-chip memory (not shown) via memory controller 1421. The memory controller 1421 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 1421 is able to communicate is provided for purposes of illustration only and is not intended as a limitation or to be exhaustive. As shown in FIG. 14, the programmable IC 1402 may include a memory management unit 1420 and translation look-aside buffer 1424 to translate virtual memory addresses used by the subsystems 1410 and 1430 to physical memory addresses used by the memory controller 1421 to access specific memory locations.

The programmable IC may include an input/output (I/O) subsystem 1450 for communication of data with external circuits. The I/O subsystem 1450 may include various types of I/O devices or interfaces including for example, flash memory type I/O devices, higher performance I/O devices, lower performance interfaces, debugging I/O devices, and/or RAM I/O devices.

The I/O subsystem 1450 may include one or more flash memory interfaces 1460 illustrated as 1460A and 1460B. For example, one or more of flash memory interfaces 1460 can be implemented as a Quad-Serial Peripheral Interface (QSPI) configured for 4-bit communication. One or more of flash memory interfaces 1460 can be implemented as a parallel 8-bit NOR/SRAM type of interface. One or more of flash memory interfaces 1460 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 1450 can include one or more interfaces 1462 providing a higher level of performance than flash memory interfaces 1460. Each of interfaces 1462A-1462C can be coupled to a DMA controller 1464A-1464C respectively. For example, one or more of interfaces 1462 can be implemented as a Universal Serial Bus (USB) type of interface. One or more of interfaces 1462 can be implemented as a gigabit Ethernet type of interface. One or more of interfaces 1462 can be implemented as a Secure Digital (SD) type of interface.

The I/O subsystem 1450 may also include one or more interfaces 1466 such as interfaces 1466A-1466D that provide a lower level of performance than interfaces 1462. For example, one or more of interfaces 1466 can be implemented as a General Purpose I/O (GPIO) type of interface. One or more of interfaces 1466 can be implemented as a Universal Asynchronous Receiver/Transmitter (UART) type of interface. One or more of interfaces 1466 can be implemented in the form of a Serial Peripheral Interface (SPI) bus type of interface. One or more of interfaces 1466 can be implemented in the form of a Controller-Area-Network (CAN) type of interface and/or an $I^2C$ type of interface. One or more of interfaces 1466 also can be implemented in the form of a timer type of interface.

The I/O subsystem 1450 can include one or more debug interfaces 1468 such as processor JTAG (PJTAG) interface 1468A and a trace interface 1468B. PJTAG interface 1468A can provide an external debug interface for the programmable IC 1402. Trace interface 1468B can provide a port to receive debug, e.g., trace, information from the processor subsystem 1410 or the programmable logic subsystem 1430.

As shown, each of interfaces 1460, 1462, 1466, and 1468 can be coupled to a multiplexer 1470. Multiplexer 1470 provides a plurality of outputs that can be directly routed or coupled to external pins of the programmable IC 1402, e.g., balls of the package within which the programmable IC 1402 is disposed. For example, I/O pins of programmable IC 1402 can be shared among interfaces 1460, 1462, 1466, and 1468. A user can configure multiplexer 1470, via a configuration data stream to select which of interfaces 1460-1468 are to be used and, therefore, coupled to I/O pins of programmable IC 1402 via multiplexer 1470. The I/O subsystem 1450, may also include a fabric multiplexer I/O (FMIO) interface (not shown) to connect interfaces 1462-1468 to programmable logic circuits of the programmable logic subsystem. Additionally or alternatively, the programmable logic subsystem 1430 can be configured to implement one or more I/O circuits within programmable logic. In some implementations, the programmable IC 1402 may also include a subsystem 1440 having various circuits for power and/or safety management. For example, the subsystem 1440 may include a power management unit 1446 configured to monitor and maintain one or more voltage domains used to power the various subsystems of the programmable IC 1402. In some implementations, the power management unit 1446 may disable power of individual subsystems, when idle, to reduce power consumption, without disabling power to subsystems in use.

The subsystem 1440 may also include safety circuits to monitor the status of the subsystems to ensure correct operation. For instance, the subsystem 1440 may include one or more real-time processors 1442 configured to monitor the status of the various subsystems (e.g., as indicated in status registers 1444). The real-time processors 1442 may be configured to perform a number of tasks in response to detecting errors. For example, for some errors, the real-time processors 1442 may generate an alert in response to detecting an error. As another example, the real-time processors 1442 may reset a subsystem to attempt to restore the subsystem to correct operation. The subsystem 1440 includes a switch network 1448 that may be used to interconnect various subsystems. For example, the switch network 1448 may be configured to connect the various subsystems 1410, 1430, and 1440 to various interfaces of the I/O subsystem 1450. In some applications, the switch network 1448 may also be used to isolate the real-time processors 1442 from the subsystems that are to be monitored. Such isolation may be required by certain application standards (e.g., IEC-61508 SIL3 or ISO-26262 standards) to ensure that the real-time processors 1442 are not affected by errors that occur in other subsystems.

Though aspects and features may in some cases be described in individual figures, it will be appreciated that features from one figure can be combined with features of another figure even though the combination is not explicitly shown or explicitly described as a combination.

In an example method for decomposing a CAM into lower cost CAMs, a set of N-bit ternary CAM rules are grouped by a memory configuration circuit into a plurality of subsets. For each of the plurality of subsets, the CAM rules in the subset are reformatted to represent each CAM rule using less than N ternary bits to produce a respective reformatted subset. Each reformatted subset of CAM rules is stored in a respective CAM circuit configured to store CAM rules having less than N ternary bits. The memory configuration circuit configures a search key formatting circuit to reformat a received search key for each subset, according to a mapping of bits of the CAM rules in the subset to bits in the corresponding reformatted subset, to produce a reformatted search key. The search key formatting circuit is also configured to input the reformatted search key to the respective CAM circuit storing the reformatted subset. In some implementations, for each of the respective CAM circuits, a respective set of local identifiers (IDs) in the CAM circuit is mapped to a set of global IDs.

In some implementations, the plurality of subsets includes at least one subset in which each of the CAM rules in the subset have the same wildcard bits and the same non-wildcard bits. In reformatting the CAM rules in the subset one or more of the wildcard bits are removed. In some implementations, reformatting of the CAM rules in the subset removes a bit having a wildcard value from the same bit position in each of the CAM rules.

In some implementations, the grouping of the CAM rules determines a wildcard mask for each CAM rule in the set and determines a number of occurrences of each wildcard mask. The wildcard mask having a highest number of occurrences is selected and the CAM rules having the selected wildcard mask are grouped to form one of the subsets. In some implementations, if any CAM rules are ungrouped and the number of subsets is a maximum number of subsets, the wildcard mask having the next highest number of occurrences is selected. CAM rules of the set having the selected wildcard mask are then grouped to form another one of the plurality of subsets.

In some implementations, the CAM rules are grouped by using centroid values. Centroid values are initialized for P subsets. For each CAM rule, a hamming distance is determined between a wildcard mask of the CAM rule and each centroid value. The subset having the centroid value with the smallest hamming distance from the wildcard mask is selected. The CAM rule is added to the selected subset. After adding the CAM rule to the subset, the centroid value for the selected subset is updated.

In some implementations, the CAM rules are grouped so that in at least one subset, the CAM rules have wildcard bits confined to a common subset of bits of the CAM rules. In some implementations, the CAM rules are grouped so that the plurality of subsets includes a subset in which bits in each of the CAM rules can be reordered, according to a common bit ordering, to place all wildcard bits in least significant bit positions.

In some implementations, after grouping the CAM rules into subset, at least one ungrouped CAM rule is expanded. The CAM rule is expanded by replacing a wildcard bit of the CAM rule with a first binary value to produce a first expanded CAM rule. The wildcard bit of the CAM rule is also replaced with a second binary value to produce a second expanded CAM rule. The first and second expanded CAM rules are added to one of the plurality of subsets. In some implementations, the respective CAM circuits may be reconfigured as additional CAM rules are input during operation. For instance, a new CAM rule may be added to one of the plurality of subsets in response to determining that the new CAM rule is compatible with the subset.

The disclosed TCAM circuits are thought to be applicable to a variety of systems, integrated circuits, and other structures utilizing TCAM memory. Other aspects and features will be apparent to those skilled in the art from consideration of the specification. For example, although aspects and features may in some cases be described in individual figures, it will be appreciated that features from one figure can be combined with features of another figure even though the combination is not explicitly shown or explicitly described as a combination. Various circuits and processes may be implemented using one or more processors configured to execute software, using application specific integrated circuits (ASICs), or using logic on a programmable integrated circuit. It is intended that the specification and drawings be considered as examples only, with a true scope of the invention being indicated by the following claims.

What is claimed is:

1. A method, comprising:
   in a memory configuration circuit, performing operations including
      grouping a set of content addressable memory (CAM) rules into a plurality of subsets, wherein for each subset, bits in each of the CAM rules can be reordered, according to a common bit ordering, to place all wildcard bits in least significant bit positions;
   for each of the plurality of subsets,
      reordering bits of each CAM rule in the subset, according to a respective bit ordering for the subset, to produce a reformatted subset;
      storing the reformatted subset in a respective algorithmic CAM circuit; and
      configuring a search key formatting circuit to, in response to receiving a search key:
         reformat the search key, according to the respective bit ordering for the subset, to produce a reformatted search key; and
         input the reformatted search key to the respective algorithmic CAM circuit storing the reformatted subset.

2. The method of claim 1, wherein the grouping of the set of CAM rules into the plurality of subsets includes:
   for each CAM rule of the set of CAM rules, determining a wildcard mask;
   creating a graph having a respective node for each unique wildcard mask; and
   for each pair of nodes in the graph:
      performing a bitwise AND of a first wildcard mask for a first node of the pair and a second wildcard mask for a second node of the pair, and
      in response to the first wildcard mask for the first node of the pair being equal to the bitwise AND of the first and second wildcard masks, adding a directed edge from the first node to the second node.

3. The method of claim 2, wherein:
   the plurality of subsets includes P subsets; and
   the grouping of the set of CAM rules into the plurality of subsets further includes:
      setting each directed edge from the respective first node to the respective second node to have a weight equal to a number of occurrences of the wildcard mask corresponding to the node;
      for each path in the graph, determining a cumulative weight of directed edges in the path;
      determining P paths in the graph having the largest cumulative weights; and for each of the P paths, grouping CAM rules of the set having wildcard masks corresponding to nodes in the path into a respective one of the plurality of subsets.

4. The method of claim 1, wherein the algorithmic CAM circuit is configured and arranged to output a CAM rule stored therein having a prefix matching the reformatted search key.

5. The method of claim 1, further comprising, for each of the respective algorithmic CAM circuits, mapping a respective set of local identifiers (IDs) in the algorithmic CAM circuit to a set of global IDs.

6. The method of claim 1, further comprising in response to input of a new CAM rule:
adding the new CAM rule to one of the plurality of subsets in response to determining that the new CAM rule is compatible with the subset.

7. The method of claim 1, further comprising:
following the grouping, expanding at least one of the set of CAM rules that remains ungrouped by:
replacing a first wildcard bit of the CAM rule with a first binary value to produce a first expanded CAM rule, and
replacing the first wildcard bit of the CAM rule with a second binary value to produce a second expanded CAM rule;
for one or more of the expanded CAM rules, expanding the expanded CAM rule by:
replacing a second wildcard bit of the expanded CAM rule with the first binary value to produce a third expanded CAM rule, and
replacing the second wildcard bit of the expanded CAM rule with the second binary value to produce a fourth expanded CAM rule; and
adding the expanded CAM rules to one of the plurality of subsets.

8. An apparatus, including:
a plurality of content addressable memory (CAM) circuits;
a memory configuration circuit configured to:
group a set of CAM rules into a plurality of subsets, each of the CAM rules having N ternary bits; and
for each of the plurality of subsets:
reformat the CAM rules in the subset for storage in a respective one of the plurality of CAM circuits configured to store CAM rules having less than N ternary bits or configured for prefix match; and
store the reformatted subset in the respective CAM circuit;
a search key formatting circuit configured to, for each of the plurality of subsets:
in response to receiving a search key, reformat the search key according to a mapping of bits in the subset to bits in the reformatted subset, to produce a respective reformatted search key; and
input the respective reformatted search key to the CAM circuit storing the reformatted subset; and
an ID translation circuit configured to, in response to one of the respective CAM circuits outputting a local ID for a matching CAM rule, translate the local ID to a unique global ID for the matching CAM rule in the set of CAM rules.

9. The apparatus of claim 8, wherein the memory configuration circuit is configured to perform the grouping of the set of CAM rules into the plurality of subsets by performing operations including:
for each CAM rule of the set of CAM rules, determining a wildcard mask;

creating a graph having a respective node for each unique wildcard mask; and
for each pair of nodes in the graph:
performing a bitwise AND of a first wildcard mask for a first node of the pair and a second wildcard mask for a second node of the pair, and
in response to the first wildcard mask for the first node of the pair being equal to the bitwise AND of the first and second wildcard masks, adding a directed edge from the first node to the second node.

10. The apparatus of claim 8, wherein
the plurality of subsets includes at least one subset in which each of the CAM rules in the subset have the same wildcard bits and the same non-wildcard bits; and
the memory configuration circuit is configured to perform the reformatting of the CAM rules in the at least one subset by performing operations including removing one or more of the wildcard bits.

11. The apparatus of claim 10, the memory configuration circuit is configured to perform the reformatting of the CAM rules in the at least one subset by performing operations including removing at least one bit from the same bit position in each of the CAM rules, wherein the at least one bit having a wildcard value in each of the CAM rules.

12. The apparatus of claim 11, wherein the memory configuration circuit is configured to perform the grouping of the set of CAM rules into the plurality of subsets by performing operations including:
determining a wildcard mask for each CAM rule in the set;
determining a number of occurrences of each wildcard mask;
selecting the wildcard mask having a highest number of occurrences; and
grouping the CAM rules of the set having the selected wildcard mask to form one of the plurality of subsets.

13. The apparatus of claim 12, wherein the memory configuration circuit is further configured to, in response to one or more of the set of CAM rules being ungrouped and the number of subsets being less than a maximum number of subsets:
select the wildcard mask having the next highest number of occurrences; and
group the CAM rules of the set having the selected wildcard mask to form another one of the plurality of subsets.

14. The apparatus of claim 13, wherein the plurality of subsets includes at least one subset in which each of the CAM rules in the subset have wildcard bits confined to a common subset of bits of the CAM rules.

15. The apparatus of claim 8, wherein the memory configuration circuit is configured to perform the grouping of the set of CAM rules into the plurality of subsets by performing operations including:
initializing centroid values for P subsets; and
for each of the set of CAM rules:
determining a hamming distance between a wildcard mask of the CAM rule and the centroid value for each of the P subsets;
selecting the subset having the centroid value with the smallest hamming distance from the wildcard mask;
adding the CAM rule to the selected subset; and
updating the centroid value for the selected subset.

16. The apparatus of claim 8, wherein
the plurality of subsets includes at least one subset in which bits in each of the CAM rules can be reordered, according to a common bit ordering, to place all wildcard bits in least significant bit positions; and the memory configuration circuit is configured to perform the reformatting of the CAM rules in the at least one subset by performing operations including reordering bits of the CAM rule according to the common bit ordering.

17. The apparatus of claim 8, wherein the memory configuration circuit is further configured to expand, following the grouping, at least one of the set of CAM rules that remains ungrouped by:

replacing a wildcard bit of the CAM rule with a first binary value to produce a first expanded CAM rule;

replacing the wildcard bit of the CAM rule with a second binary value to produce a second expanded CAM rule; and adding the first and second expanded CAM rules to one of the plurality of subsets.

18. The apparatus of claim 8, wherein the memory configuration circuit is further configured to add a new CAM rule to one of the plurality of subsets in response to determining that the new CAM rule is compatible with the subset.

19. A method, comprising:

in a memory configuration circuit, performing operations including:

grouping a set of content addressable memory (CAM) rules into a plurality of subsets, each of the CAM rules having N ternary bits; and for each of the plurality of subsets, reformatting each CAM rule in the subset to represent the CAM rule using less than N ternary bits to produce a respective reformatted subset of CAM rules;

storing the reformatted subset of CAM rules in a respective CAM circuit configured to store CAM rules that are less than N ternary bits; and configuring a search key formatting circuit to, in response to receiving a search key:

reformat the search key, according to a mapping of bits of the CAM rules in the subset to bits in the corresponding reformatted subset, to produce a reformatted search key; and input the reformatted search key to the respective CAM circuit storing the reformatted subset.

20. The method of claim 19, wherein:

the plurality of subsets includes at least one subset in which each of the CAM rules in the subset have the same wildcard bits and the same non-wildcard bits; and the reformatting of the CAM rules in the at least one subset includes removing one or more of the wildcard bits.

* * * * *